(12) United States Patent  
Tuganov et al.

(10) Patent No.: US 7,042,917 B2  
(45) Date of Patent: *May 9, 2006

(54) LASER APPARATUS WITH ACTIVE THERMAL TUNING OF EXTERNAL CAVITY

(75) Inventors: Alexander V. Tuganov, Redwood City, CA (US); Mark S. Rice, San Jose, CA (US); Mark McDonald, Milpitas, CA (US); Brad V. Johnson, Santa Clara, CA (US); Paul Chi-Hwa Lin, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 227 days.

This patent is subject to a terminal disclaimer.

(21) Appl. No.: 10/625,913

(22) Filed: Jul. 22, 2003

(65) Prior Publication Data

US 2005/0078717 A1 Apr. 14, 2005

Related U.S. Application Data

(63) Continuation of application No. 09/900,443, filed on Jul. 6, 2001, now Pat. No. 6,658,031.

(51) Int. Cl.
*H01S 3/10* (2006.01)
(52) U.S. Cl. .......................... 372/20; 372/36
(58) Field of Classification Search ............ 372/20, 372/19, 32, 34, 92, 97, 29.023, 29.016, 33, 372/36

See application file for complete search history.

(56) References Cited

U.S. PATENT DOCUMENTS 3,788,743 A 1/1974 George (Continued)

FOREIGN PATENT DOCUMENTS

EP 0 924 628 A2 6/1999
WO WO 98/05105 2/1998
WO WO 98/44424 10/1998

OTHER PUBLICATIONS

Ketelsen, L. J. P., "Simple Technique for Measuring Cavity Loss in Semiconductor Laser," *Electronics Letters*, (Aug. 18, 1994), vol. 30, No. 17, pp. 1422-1424.

(Continued)

*Primary Examiner*—Minsun Oh Harvey
*Assistant Examiner*—Tuan N. Nguyen
(74) *Attorney, Agent, or Firm*—Blakely, Sokoloff, Taylor & Zafman LLP

(57) ABSTRACT

A laser apparatus and method that uses active thermalization of a reflective element to minimize losses and provide wavelength stability. The laser comprises first and second reflectors defining an external cavity, and a compensating member coupled to at least one of the reflectors and configured to thermally position one reflector with respect to the other reflector. The compensating member may be coupled directly to the first reflector and configured to position first reflector with respect to said second reflector. The thermal positioning may be carried out by a thermoelectric controller operatively coupled to the compensating member and configured to thermally adjust the compensating member by heating or cooling thereof. The laser apparatus may comprise a gain medium having first and second output facets and emitting a coherent beam from the first output facet along an optical path. The first reflector is positioned in the optical path, with the second output facet and first reflector defining an external cavity. The compensating member may be thermally conductive and have a high coefficient of thermal expansion.

18 Claims, 7 Drawing Sheets

U.S. PATENT DOCUMENTS

| | | | |
|---|---|---|---|
| 3,899,748 A | 8/1975 | Bodlaj | |
| 3,921,099 A | 11/1975 | Abrams et al. | |
| 3,965,440 A | 6/1976 | Graves | |
| 3,967,211 A | 6/1976 | Itzkan et al. | |
| 4,309,671 A | 1/1982 | Malyon | |
| 4,410,992 A | 10/1983 | Javan | |
| 4,460,977 A | 7/1984 | Shimada et al. | |
| 4,504,950 A | 3/1985 | AuYeung | |
| 4,560,246 A | 12/1985 | Cotter | |
| 4,583,227 A | 4/1986 | Kirkby | |
| 4,730,105 A | 3/1988 | Mitschke et al. | |
| 4,770,047 A | 9/1988 | Arditty et al. | |
| 4,839,614 A | 6/1989 | Hill et al. | |
| 4,843,233 A | 6/1989 | Jeunhomme | |
| 4,847,854 A | 7/1989 | Van Dijk | |
| 4,870,269 A | 9/1989 | Jeunhomme et al. | |
| 4,932,782 A | 6/1990 | Graindorge et al. | |
| 4,934,816 A | 6/1990 | Silver et al. | |
| 4,994,677 A | 2/1991 | Graindorge | |
| 5,022,745 A | 6/1991 | Zayhowski et al. | |
| 5,028,395 A | 7/1991 | Sebille et al. | |
| 5,058,124 A | 10/1991 | Cameron et al. | |
| 5,103,457 A | 4/1992 | Wallace et al. | |
| 5,115,677 A | 5/1992 | Martin et al. | |
| 5,124,993 A | 6/1992 | Braunlich et al. | |
| 5,141,316 A | 8/1992 | Lefevre et al. | |
| 5,163,063 A | 11/1992 | Yoshikawa et al. | |
| 5,172,185 A | 12/1992 | Leuchs et al. | |
| 5,181,078 A | 1/1993 | Lefevre et al. | |
| 5,181,214 A | 1/1993 | Berger et al. | |
| 5,185,643 A | 2/1993 | Vry et al. | |
| 5,225,930 A | 7/1993 | Land et al. | |
| 5,270,791 A | 12/1993 | Lefevre et al. | |
| 5,289,491 A | 2/1994 | Dixon | |
| 5,305,330 A | 4/1994 | Rieder et al. | |
| 5,319,668 A | 6/1994 | Luecke | |
| 5,321,717 A | 6/1994 | Adachi et al. | |
| 5,331,651 A | 7/1994 | Becker et al. | |
| 5,347,527 A | 9/1994 | Favre et al. | |
| 5,349,439 A | 9/1994 | Graindorge et al. | |
| 5,349,440 A | 9/1994 | DeGroot | |
| 5,373,515 A | 12/1994 | Wakabayashi et al. | |
| 5,387,974 A | 2/1995 | Nakatani | |
| 5,412,474 A | 5/1995 | Reasenberg et al. | |
| 5,412,676 A | 5/1995 | Schnier et al. | |
| 5,414,280 A | 5/1995 | Girmay | |
| 5,418,800 A | 5/1995 | Prior et al. | |
| 5,420,687 A | 5/1995 | Kachanov | |
| 5,428,700 A | 6/1995 | Hall | |
| 5,438,579 A | 8/1995 | Eda et al. | |
| 5,444,724 A | 8/1995 | Goto | |
| 5,450,202 A | 9/1995 | Tisue | |
| 5,473,625 A | 12/1995 | Hansen et al. | |
| 5,543,916 A | 8/1996 | Kachanov | |
| 5,583,638 A | 12/1996 | Cutler | |
| 5,594,744 A | 1/1997 | Lefevre et al. | |
| 5,606,439 A | 2/1997 | Wu | |
| 5,631,736 A | 5/1997 | Thiel et al. | |
| 5,673,129 A | 9/1997 | Mizrahi | |
| 5,712,704 A | 1/1998 | Martin et al. | |
| 5,719,674 A | 2/1998 | Martin et al. | |
| 5,737,109 A | 4/1998 | Goodwin | |
| 5,751,750 A | 5/1998 | Friede et al. | |
| 5,760,391 A | 6/1998 | Narendran | |
| 5,777,773 A | 7/1998 | Epworth et al. | |
| 5,802,085 A | 9/1998 | Lefevre et al. | |
| 5,812,716 A | 9/1998 | Ohishi | |
| 5,825,792 A | 10/1998 | Villeneuve et al. | |
| 5,848,092 A | 12/1998 | Mitsumoto et al. | |
| 5,872,881 A | 2/1999 | Rossi et al. | |
| 5,886,785 A | 3/1999 | Lefevre et al. | |
| 5,917,188 A | 6/1999 | Atkinson et al. | |
| 5,943,352 A | 8/1999 | Fee | |
| 5,946,331 A | 8/1999 | Amersfoort et al. | |
| 5,991,061 A | 11/1999 | Adams et al. | |
| 6,018,535 A | 1/2000 | Maeda | |
| 6,034,799 A | 3/2000 | Hansen | |
| 6,040,950 A | 3/2000 | Broome | |
| 6,044,095 A | 3/2000 | Asano et al. | |
| 6,061,369 A | 5/2000 | Conradi | |
| 6,064,501 A | 5/2000 | Roberts et al. | |
| 6,081,539 A | 6/2000 | Mattori et al. | |
| 6,084,695 A | 7/2000 | Martin et al. | |
| 6,108,355 A | 8/2000 | Zorabedian | |
| 6,115,121 A | 9/2000 | Erskine | |
| 6,151,337 A | 11/2000 | Carlsten et al. | |
| 6,181,717 B1 | 1/2001 | Kner et al. | |
| RE37,044 E | 2/2001 | Wu | |
| 6,192,058 B1 | 2/2001 | Abeles | |
| 6,201,638 B1 | 3/2001 | Hall et al. | |
| 6,205,159 B1 | 3/2001 | Sesko et al. | |
| 6,215,802 B1 | 4/2001 | Lunt | |
| 6,229,835 B1 | 5/2001 | Tomaru et al. | |
| 6,246,480 B1 | 6/2001 | O'Brien | |
| 6,249,364 B1 | 6/2001 | Martin et al. | |
| 6,249,365 B1 | 6/2001 | Mizrahi et al. | |
| 6,252,718 B1 | 6/2001 | Lefevre | |
| 6,259,712 B1 | 7/2001 | DeCain et al. | |
| 6,263,004 B1 | 7/2001 | Arvidsson et al. | |
| 6,282,215 B1 | 8/2001 | Zorabedian et al. | |
| 6,301,280 B1 | 10/2001 | Broutin et al. | |
| 6,304,586 B1 | 10/2001 | Pease et al. | |
| 6,330,253 B1 * | 12/2001 | Tuganov et al. | 372/9 |
| 6,331,892 B1 | 12/2001 | Green | |
| 6,337,660 B1 | 1/2002 | Esman et al. | |
| 6,366,592 B1 | 4/2002 | Flanders | |
| 6,366,689 B1 | 4/2002 | Rao et al. | |
| 6,404,538 B1 | 6/2002 | Chen et al. | |
| 6,438,147 B1 * | 8/2002 | Roychoudhuri et al. | 372/20 |
| 6,441,933 B1 | 8/2002 | Jang | |
| 6,470,036 B1 | 10/2002 | Bailey et al. | |
| 6,493,365 B1 * | 12/2002 | Wu et al. | 372/20 |
| 6,526,071 B1 * | 2/2003 | Zorabedian et al. | 372/20 |
| 6,532,091 B1 | 3/2003 | Miyazaki et al. | |
| 2002/0048297 A1 | 4/2002 | Irie et al. | |
| 2002/0126345 A1 | 9/2002 | Green et al. | |

OTHER PUBLICATIONS

Shtengel, G. E., et al., "Internal Optical Loss Measurements in 1.3um InGaAsP Lasers," *Electronic Letters*, (Jul. 6, 1995), vol. 31, No. 14, pp. 1157-1159.

Favre, F. et al., "External-Cavity Semiconductor Laser With 15nm Continuous Tuning Range," Electronics Letters, vol. 22, No. 15, Jul. 19, 1986, pp. 795-796.

Mellis, J. et al., "Miniature packaged external-cavity semiconductor laser with 50 GHz continuous electrical tuning range," Electronics Letters, vol. 24, No. 16, Aug. 4, 1988, pp. 988-989.

MacLeod, H.A., "Thin Film Optical Filters," 2.sup.nd Edition, McGraw-Hill, 1989, pp. 244-269.

Scobey, M. A. and Stupik, P. D., "Stable ultranarrow bandpass filters," Proc. SPIE Int. Soc. Opt. Eng. 2262, 1994, pp. 37-46.

Rosenberg, K. P. et al., "Logarithmically variable infrared etalon filters," Proc. SPIE Int. Soc. Opt. Eng. 2262, 1994, pp. 223-262.

Takahashi, H., "Temperature Stability of Thin-Film Narrow-Bandpass Filters Produced by Ion-Assisted Deposition," Applied Optics, vol. 34, No. 4, Feb. 1, 1995, pp. 667-675.

\* cited by examiner

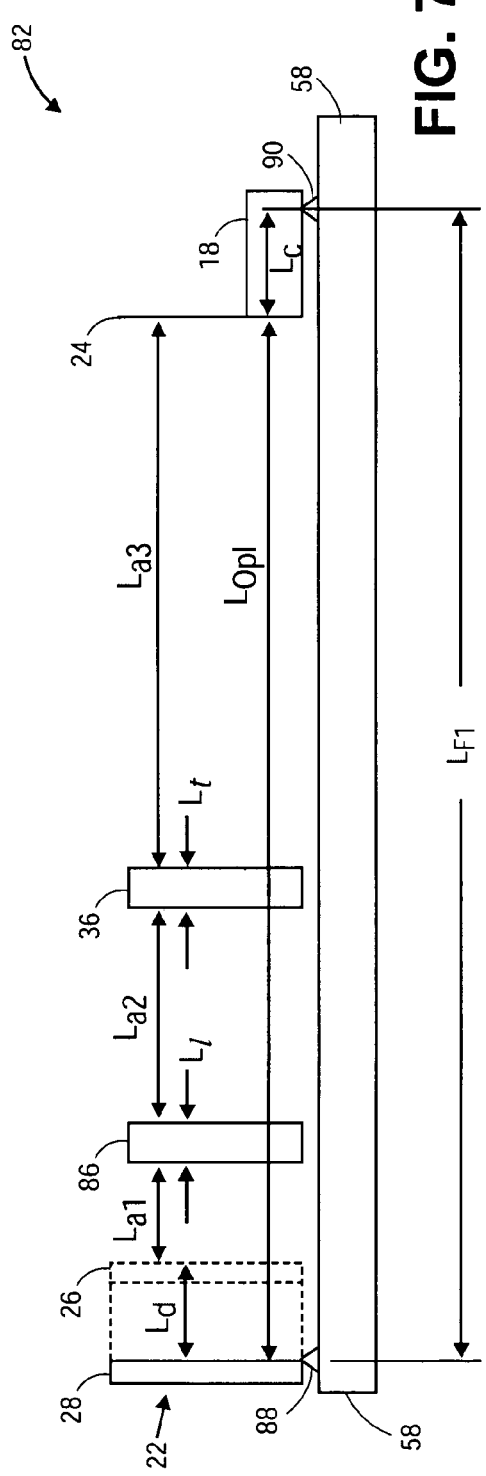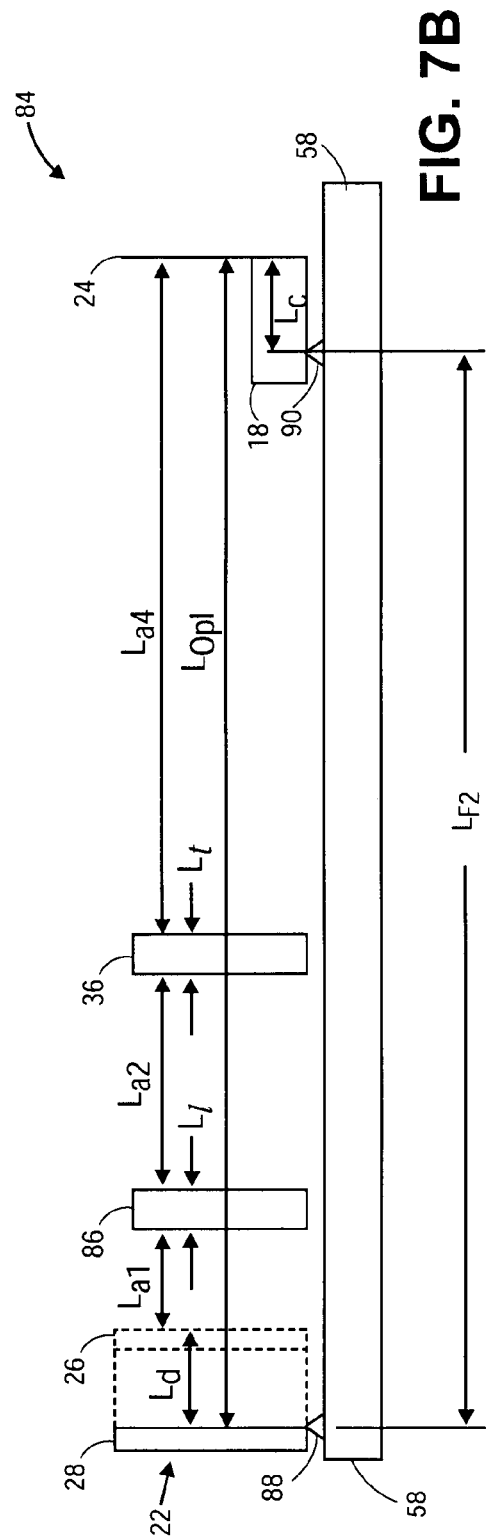

LASER APPARATUS WITH ACTIVE THERMAL TUNING OF EXTERNAL CAVITY

The present application is a Continuation Application of U.S. application Ser. No. 09/900,443 filed Jul. 6, 2001 now U.S. Pat. No. 6,658,031.

BACKGROUND OF THE INVENTION

Fiberoptic telecommunications are continually subject to demand for increased bandwidth. One way that bandwidth expansion has been accomplished is through dense wavelength division multiplexing (DWDM) wherein multiple separate data streams exist concurrently in a single optical fiber, with modulation of each data stream occurring on a different channel. Each data stream is modulated onto the output beam of a corresponding semiconductor transmitter laser operating at a specific channel wavelength, and the modulated outputs from the semiconductor lasers are combined onto a single fiber for transmission in their respective channels. The International Telecommunications Union (ITU) presently requires channel separations of approximately 0.4 nanometers, or about 50 GHz. This channel separation allows up to 128 channels to be carried by a single fiber within the bandwidth range of currently available fibers and fiber amplifiers. Improvements in fiber technology together with the ever-increasing demand for greater bandwidth will likely result in smaller channel separation in the future.

The drive towards greater bandwidth has led to use of precision, wavelength-specific DWDM devices that require careful adjustment in order to provide a transmission output at the narrowly separated channel spacings. As tunable elements are configured for narrower channel separation, decreasing component tolerances and thermal fluctuation become increasingly important. In particular, tunable telecommunication transmitter lasers are susceptible to non-optimal positioning of tunable elements due to environmental thermal fluctuation that results in wavelength instability and reduced transmitter output power. There is currently a need for a telecommunication transmitter laser which provides for simple and accurate adjustment of tunable elements to reduce losses and wavelength stability associated with thermal fluctuation and other environmental factors present during laser operation.

SUMMARY OF THE INVENTION

The invention is a laser apparatus and method that uses active thermal adjustment of a laser cavity reflective element to minimize losses and provide wavelength stability. The apparatus of the invention, in general terms, is a laser comprising first and second reflectors defining a laser cavity, and a compensating member coupled to at least one of the reflectors and configured to thermally position the one reflector with respect to the other reflector. The compensating member may be coupled directly to the first reflector and configured to position the first reflector with respect to the second reflector. The thermal positioning may be carried out by a thermoelectric controller operatively coupled to the compensating member and configured to thermally adjust the compensating member by heating or cooling thereof.

More specifically, the laser apparatus may comprise a gain medium having first and second output facets and emitting a light beam from the first output facet along an optical path. The first reflector is positioned in the optical path, with the second output facet and first reflector defining a laser cavity. The compensating member may be thermally conductive and have a high coefficient of thermal expansion.

In certain embodiments the gain medium and first reflector may be passively athermalized or thermally stabilized with respect to each other. In this regard, the laser may further comprise a base, with the compensating member and gain medium mounted on the base. The base has a first, selected coefficient of thermal expansion, and the compensating member has a second, selected coefficient of thermal expansion, and the base and compensating member are dimensioned and configured to passively athermalize the external cavity. The passive thermal stabilization may be carried out concurrently with the active thermal control of the end mirror by heating or cooling of the compensating member.

The laser apparatus may further comprise a grid generator positioned in the optical path before the end mirror, and in some embodiments may further comprise a channel selector positioned in the optical path before the end mirror and configured to tune or adjust the output wavelength of the laser. The grid generator may comprise a grid etalon mounted to the base. The channel selector may be coupled to the base via a drive or tuning assembly. The grid etalon and channel selector may also be subject to passive thermal stabilization through the base. The grid etalon may additionally be coupled to a thermoelectric controller and subject to active thermal control.

In other embodiments the laser may also comprise a detector associated with the external cavity that is configured to detect losses aspects of the external cavity. The detector may be an optical detector positioned to monitor optical output from the external cavity, or may be a voltage sensor positioned to monitor voltage across the gain medium. Error signals derived from the output of the detector may be utilized by a controller to adjust the external cavity by thermal positioning of the end mirror via heating or cooling the compensating member.

The laser may further comprise a dither element operatively coupled to the external cavity and configured to introduce a detectable frequency modulation into the external cavity. The dither element may be associated with the end mirror or located elsewhere in the external cavity. The frequency modulation introduced by the dither element results in a known or predictable intensity and/or phase variation in optical feedback from the external cavity to the gain medium. This intensity and/or phase variation from the dither is detectable in either the monitored voltage across the gain medium or the optical output of from the external cavity. The positioning of the end mirror via heating or cooling the compensating element effects the phase and intensity of the modulation signal, and the magnitude and phase of the modulation signal as detected via voltage or optical power modulation may be used to generate an error signal. The error signal is usable to position or otherwise adjust the end mirror to null the error signal according to thermal positioning of the end mirror by the compensating member.

The method of the invention is a method of laser operation that comprises, in general terms, providing first and second reflectors that define a laser cavity, and adjusting the laser cavity by thermally adjusting a compensating member coupled to at least one of the reflectors. The thermally adjusting of the compensating member comprises heating or cooling the compensating member with a thermoelectric controller coupled to the compensating member. The method may further comprise passively athermalizing or thermally stabilizing the laser cavity, and monitoring external losses associated with the laser cavity. The thermal adjusting may be carried out according to error signals derived from the monitoring of losses associated with the external cavity. The method may further comprise introducing a frequency modulation into the external cavity, and deriving error signals according to amplitude and phase of detected frequency modulation.

BRIEF DESCRIPTIONS OF THE DRAWINGS

FIG. 7A and FIG. 7B. are schematic illustrations of considerations involving the use of passive athermalization of an external cavity in accordance with the invention.

DETAILED DESCRIPTION OF THE INVENTION

Referring more specifically to the drawings, for illustrative purposes the present invention is embodied in the apparatus and method shown in FIG. 1 through FIG. 7. It will be appreciated that the apparatus may vary as to configuration and as to details of the parts, and that the method may vary as to details and the order of events, without departing from the basic concepts as disclosed herein. The invention is disclosed primarily in terms of use with an external cavity laser. However, it will be readily apparent to those skilled in the art that the invention may be used with other laser devices and optical systems. It also should be understood that the terminology used herein is for the purpose of describing particular embodiments only, and is not intended to be limiting.

Figure 1:
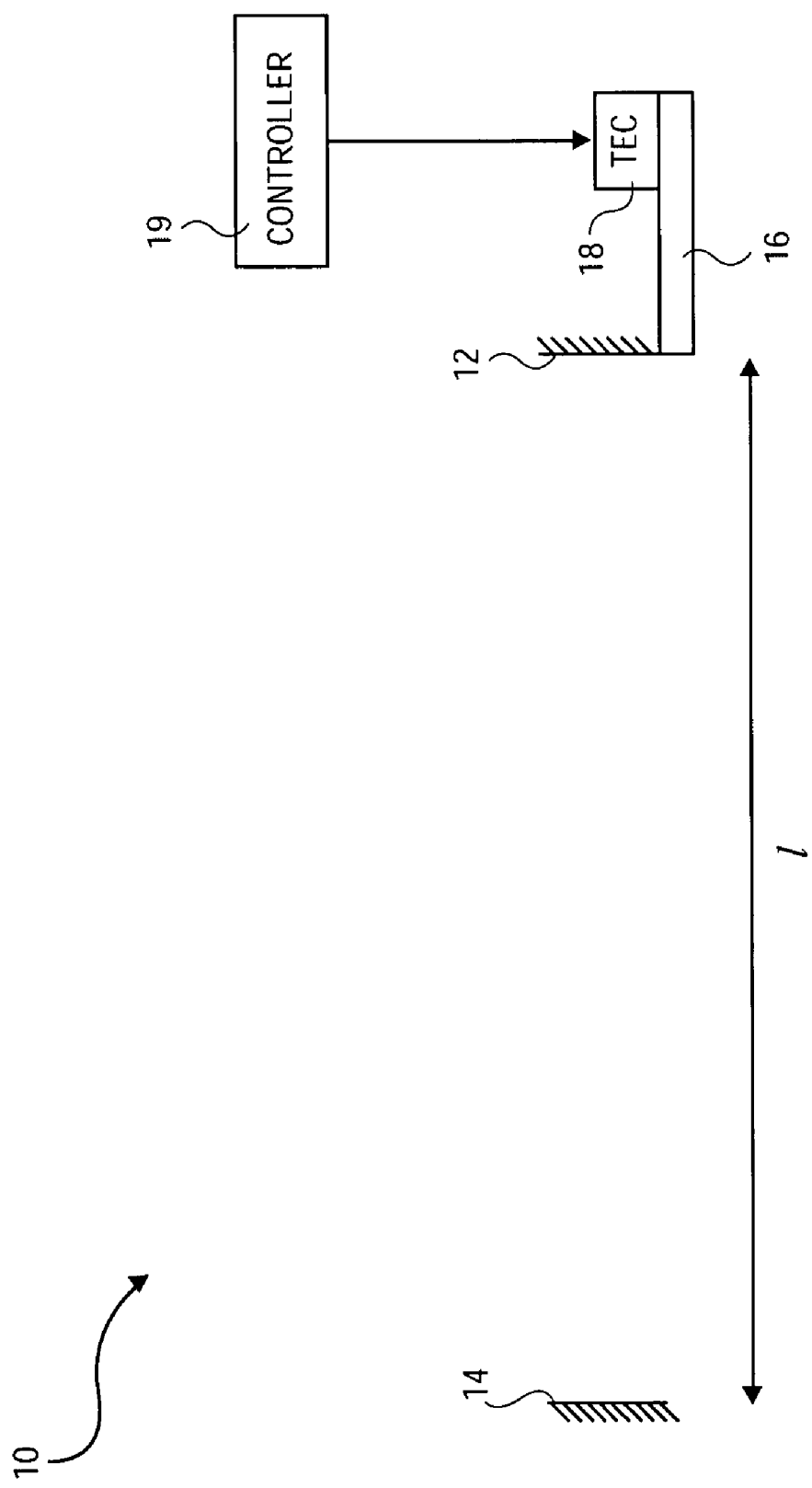
FIG. 1 is a schematic diagram of an external cavity utilizing thermal positioning of an end reflector with a compensating member in accordance with the invention.

Referring now to FIG. 1, there is shown an external cavity apparatus 10 that employs thermal control of the external cavity optical path length in accordance with the invention. The apparatus 10 includes a first reflective element 12 and a second reflective element 14 which together define an external cavity of optical path length l. A gain medium (not shown) may be positioned between reflective elements 12, 14, or one of reflective elements 12, 14 may comprise a mirrored or partially mirrored surface of a gain medium as described further below. Various other optical components usable in external cavity lasers, such as a grid generator and channel selector (not shown) may also be positioned within the external cavity defined by reflectors 12, 14, as also described below. Reflective elements 12, 14 may be mounted on or associated with a common base (not shown).

First reflector 12 is coupled or joined to a compensating element or member 16 that is configured to positionally adjust reflective element 12 by active thermal control. Compensating member 16 is made from a material having a high, or relatively high, coefficient of thermal expansion (CTE), such as aluminum, zinc or other metal or metal alloy. For example, aluminum has a CTE with $24*10^-6/°$ C. and zinc with $30.2*10^-6/°$ C. KOVAR® alloy, which may also be used, has a moderate coefficient with $4.8*10-6/°$ C. Various other materials of suitable CTE will suggest themselves to those skilled in the art upon review of this disclosure.

The material of compensating member 16 ideally will be thermally conductive so that member 16 can be rapidly heated and cooled. A thermoelectric controller 18 is operatively coupled to compensating member 16 and is configured to heat or cool compensating member 16, which in turn undergoes corresponding thermal expansion or contraction to positionally adjust the reflector 12 coupled to compensating member 16.

Thus, heating of compensating member 16 by thermoelectric controller 18 results in thermal expansion of compensating member 16 that moves reflector 12 closer to reflector 14 to shorten optical path length l. Cooling of compensating member 16 by thermoelectric controller 18 results in a thermal contraction of compensating member 16 such that reflector 12 is moved away from reflector 14 to increase external cavity optical path length l. In some embodiments, compensating member 18 may be coupled to both reflectors 12, 14, such that the heating and resultant thermal expansion of compensating member serves to move reflectors apart to increase the external cavity optical path length l, and the cooling and resultant shrinkage of compensating member 16 draws reflectors 12, 14 together to shorten optical path length l. An additional controller 20 may be operatively coupled to thermoelectric controller 19 to provide heating or cooling instructions thereto based on error signals derived from monitoring the loss characteristics of the external cavity defined by reflectors 12, 14, as described further below.

Figure 2:
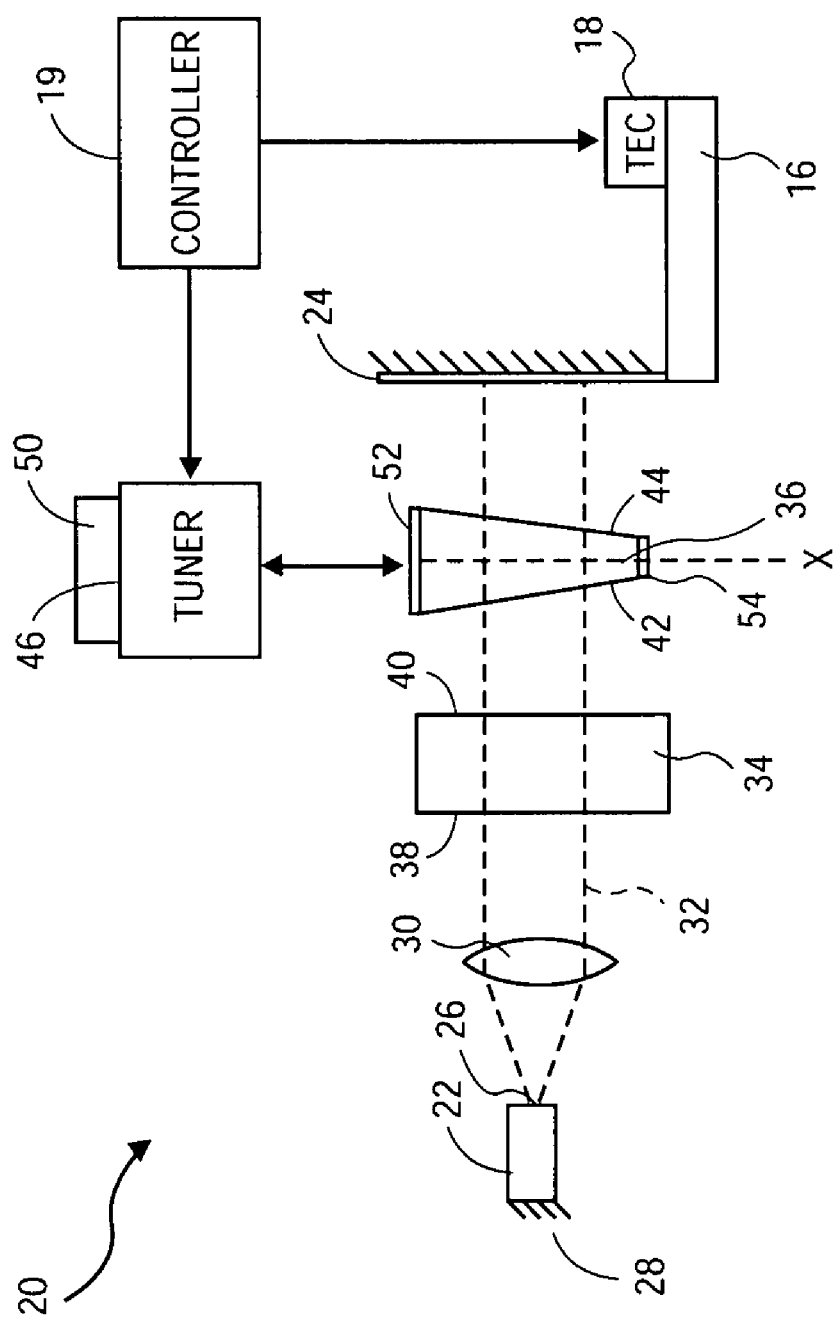
FIG. 2 is an external cavity laser with active thermal control of the external cavity in accordance with the invention.

Referring now to FIG. 2, an external cavity laser apparatus 20 in accordance with the invention is shown, wherein like reference numbers are used to denote like parts. The apparatus 20 includes a gain medium 22 and an end reflective element 24. Gain medium 22 may comprise a conventional Fabry-Perot diode emitter chip and has an anti-reflection (AR) coated front facet 26 and a partially reflective rear facet 28. The external laser cavity is delineated by rear facet 28 and end mirror 24, and has an optical path length l. Gain medium 22 emits a coherent light beam from front facet 26 that is collimated by lens 30 to define an optical path 32 that is co-linear with the optical axis of the external cavity. Front and rear facets 26, 28 of gain medium 22 are aligned with the optical axis of the external cavity as well. Conventional output coupler optics (not shown) are associated with rear facet 28 for coupling the output of external cavity laser 20 into an optical fiber (also not shown). End mirror 24 is coupled to a compensating member 16 as described above, which is made of a thermally conductive, high coefficient of thermal expansion material. Compensation member 16 is coupled to thermoelectric controller 18, which in turn is operatively coupled to controller 19.

The external cavity laser 20 includes a grid generator element and a tunable element, which are respectively shown in FIG. 2 as a grid etalon 36 and a wedge etalon channel selector 36 positioned in optical path 32 between gain medium 22 and end mirror 24. Grid etalon 34 typically is positioned in optical path 32 before tunable element 36, and has parallel reflective faces 38, 40. Grid etalon 34 operates as an interference filter, and the refractive index of grid etalon 34 and the optical thickness of grid etalon 34 as defined by the spacing of faces 38, 40 give rise to a multiplicity of minima within the communication band at wavelengths which coincide with the center wavelengths of a selected wavelength grid which may comprise, for example, the ITU (International Telecommunications Union) grid. Other wavelength grids may alternatively be selected. Grid etalon has a free spectral range (FSR) that corresponds to the spacing between the grid lines of the ITU grid, and the grid etalon 34 thus operates to provide a plurality of pass bands centered on each of the gridlines of the wavelength grid. Grid etalon 34 has a finesse (free spectral range divided by full width half maximum or FWHM) that suppresses neighboring modes of the external cavity laser between each channel of the wavelength grid.

Grid etalon 34 may be a parallel plate solid, liquid or gas spaced etalon, and may be tuned by precise dimensioning of the optical thickness between faces 38, 40 by thermal expansion and contraction via temperature control. The grid etalon 34 may alternatively be tuned by tilting to vary the optical thickness between faces 38, 40, or by application of an electric field to an electrooptic etalon material. Grid etalon 34 also may be actively tuned to selected communication grids as described in U.S. patent application Ser. No. 09/900,474 entitled "External Cavity Laser with Continuous Tuning of Grid Generator" to inventor Andrew Daiber, filed concurrently herewith, the disclosure of which is incorporated herein by reference.

Wedge etalon channel selector 36 also acts as an interference filter, with non-parallel reflective faces 42, 44 providing a tapered shape. Wedge etalon 36 may comprise a tapered transparent substrate, a tapered air gap between the reflective surfaces of adjacent transparent substrates, or a thin film "wedge interference filter". Wedge etalon 26 as shown in FIG. 2 is only one tunable element that may be used in accordance with the invention in an external cavity laser. Wedge etalon 26 may be replaced with a variety of tunable elements other than an etalon, such as grating devices and electro-optic devices. The use of an air gap wedge etalon as a channel selector is described in U.S. Pat. No. 6,108,355, wherein the "wedge" is a tapered air gap defined by adjacent substrates. The use of pivotally adjustable grating devices as channel selectors tuned by grating angle adjustment and the use of an electro-optic tunable channel selector in an external cavity laser and tuned by selective application of voltage are described in U.S. patent application Ser. No. 09/814,646 to inventor Andrew Daiber and filed on Mar. 21, 2001. The use of a translationally tuned graded thin film interference filter is described in U.S. patent application Ser. No. 09/814,646 and in U.S. patent application Ser. No. 09/900,412 entitled "Graded Thin Film Wedge Interference Filter and Method of Use for Laser Tuning" to inventors Hopkins et al., co-filed herewith. The aforementioned disclosures are incorporated herein by reference.

The relative size, shape and distances between the various optical components of external cavity laser 20 are in some instances exaggerated for clarity and are not necessarily shown to scale. External cavity laser 20 may include additional components (not shown), such as focusing and collimating components, and polarizing optics configured to remove spurious feedback associated with the various components of external cavity laser 20.

The pass bands defined by the wedge etalon 36 are substantially broader than the pass bands of the grid etalon 34, with the broader pass bands of the wedge etalon 26 a periodicity substantially corresponding to the separation between the shortest and longest wavelength channels defined by the grid etalon 34. In other words, the free spectral range of the wedge etalon 36 corresponds to the full wavelength range of the wavelength grid defined by grid etalon 34. The wedge etalon 36 has a finesse that suppresses channels adjacent to a particular selected channel.

The wedge etalon 36 is used to select between multiple communication channels by changing the optical thickness between faces 42, 44 of wedge etalon 36. This is achieved by translating or driving wedge etalon 36 along axis x, which is parallel to the direction of taper of wedge etalon 36 and perpendicular to optical path 32 and the optical axis of external cavity laser 20. Each of the pass bands defined by the wedge etalon 36 supports a selectable channel, and as the wedge is advanced or translated into optical path 32, the beam traveling along optical path 32 passes through increasingly thicker portions of wedge etalon 36 which support constructive interference between opposing faces 42, 44 at longer wavelength channels. As wedge etalon 36 is withdrawn from optical path 32, the beam will experience increasingly thinner portions of wedge etalon 36 and expose pass bands to the optical path 32 that support correspondingly shorter wavelength channels. The free spectral range of wedge etalon 36 corresponds to the complete wavelength range of grid etalon 34 as noted above, so that a single loss minimum within the communications band can be tuned across the wavelength grid. The combined feedback to gain medium 22 from the grid etalon 34 and wedge etalon 36 support lasing at the center wavelength of a selected channel. Across the tuning range, the free spectral range of the wedge etalon 36 is broader than that of grid etalon 34.

Wedge etalon 36 is positionally tuned via a tuning assembly that comprises a drive element or wavelength tuner 46 structured and configured to adjustably position wedge etalon 36 according to selected channels. Tuner 46 may comprise a stepper motor together with suitable hardware for precision translation of wedge etalon 36. Tuner 46 may alternatively comprise various types of actuators, including, but not limited to, DC servomotors, solenoids, voice coil actuators, piezoelectric actuators, ultrasonic drivers, shape memory devices, and like linear actuators known in the art.

Wavelength tuner 46 is operatively coupled to a controller 19 that provides signals to control the positioning of wedge etalon 36 by tuner 46. Controller 19 may include a data processor and memory (not shown) wherein are stored lookup tables of positional information for wedge etalon 36 that correspond to selectable channel wavelengths. Controller 19 as shown is also coupled to thermoelectric controller 18 and provides controlling instructions to both the wavelength tuner 46 and thermoelectric controller 18. A separate controller (not shown) may alternatively be used for wavelength tuner 46, and may be internal to tuner 46, or may be external and shared in other component tuning and servo functions of external cavity laser 20.

When external cavity laser 20 is tuned to a different communication channel, controller 19 signals tuner 46 according to positional data stored in the look up table, and tuner 46 translates or drives wedge etalon 36 to the correct position wherein the optical thickness of the portion of the wedge etalon 36 positioned in optical path 32 provides constructive interference which supports the selected channel. A linear encoder 50 may be used in association with wedge etalon 36 and tuner 46 to ensure correct positioning of wedge etalon 36 by tuner 46.

Wedge etalon 36 may include opaque regions 52, 54 at its ends that are optically detectable and which serve to verify the position of wedge etalon 36 when it has been positionally tuned to its longest or shortest channel wavelength. Opaque regions 36 provide an additional encoder mechanism usable in the positional tuning of wedge etalon 36. When wedge 36 is moved into a position such that one of opaque regions 52, 54 enters optical path 32, the opaque region 52, 54 will block or attenuate the beam along optical path. This attenuation of light is detectable, as described further below. Since the location of opaque regions 52, 54 on wedge etalon 36 can be determined with precision, controller 38 can anticipate when an opaque region 52, 54 will enter optical path 32. Appearance of an opaque region 52, 54 in optical path 32 at a point other than predicted will indicate an encoder error, and controller 19 can make an appropriate correction based on the detected presence of an opaque region 52, 54 in optical path 32. Additional opaque regions (not shown) may be included elsewhere on wedge etalon 36.

In the operation of laser 20, wedge etalon 36 is positionally adjusted in optical path 32 to select transmission or pass bands defined by grid etalon 34. The external cavity is tuned by positioning end mirror 34 by heating or cooling of compensating member 18 to lock the external cavity to the selected channel wavelength. The pass band relationship of the grid etalon 34, wedge etalon 36 and the external cavity defined by rear facet 28 and end mirror 24, are illustrated graphically in FIG. 3A through FIG. 3C, which show external cavity pass bands PB1, grid etalon pass bands PB2, and wedge etalon pass bands PB3. Relative gain is shown on the vertical axis and wavelength on the horizontal axis. As can be seen, free spectral range of the wedge etalon 36 ($FSR_{Channel\ Sel}$) is greater than the free spectral range of the grid etalon 34 ($FSR_{Grid\ Gen}$), which in turn is greater than the free spectral range of the external cavity ($FSR_{Cavity}$). The band pass peaks PB1 of the external cavity periodically align with the center wavelengths of pass bands PB2 defined by the wavelength grid of grid etalon 24. There is one pass band peak PB3 from the wedge etalon 36 that extends over all of the pass bands PB2 of the wavelength grid. In the specific example shown in FIG. 3A-3C, the wavelength grid extends over sixty four channels spaced apart by one half nanometer (nm) or 62 GHz, with the shortest wavelength channel at 1532 nm, and the longest wavelength channel at 1563.5 nm.

Figures 3A, 3B, 3C:
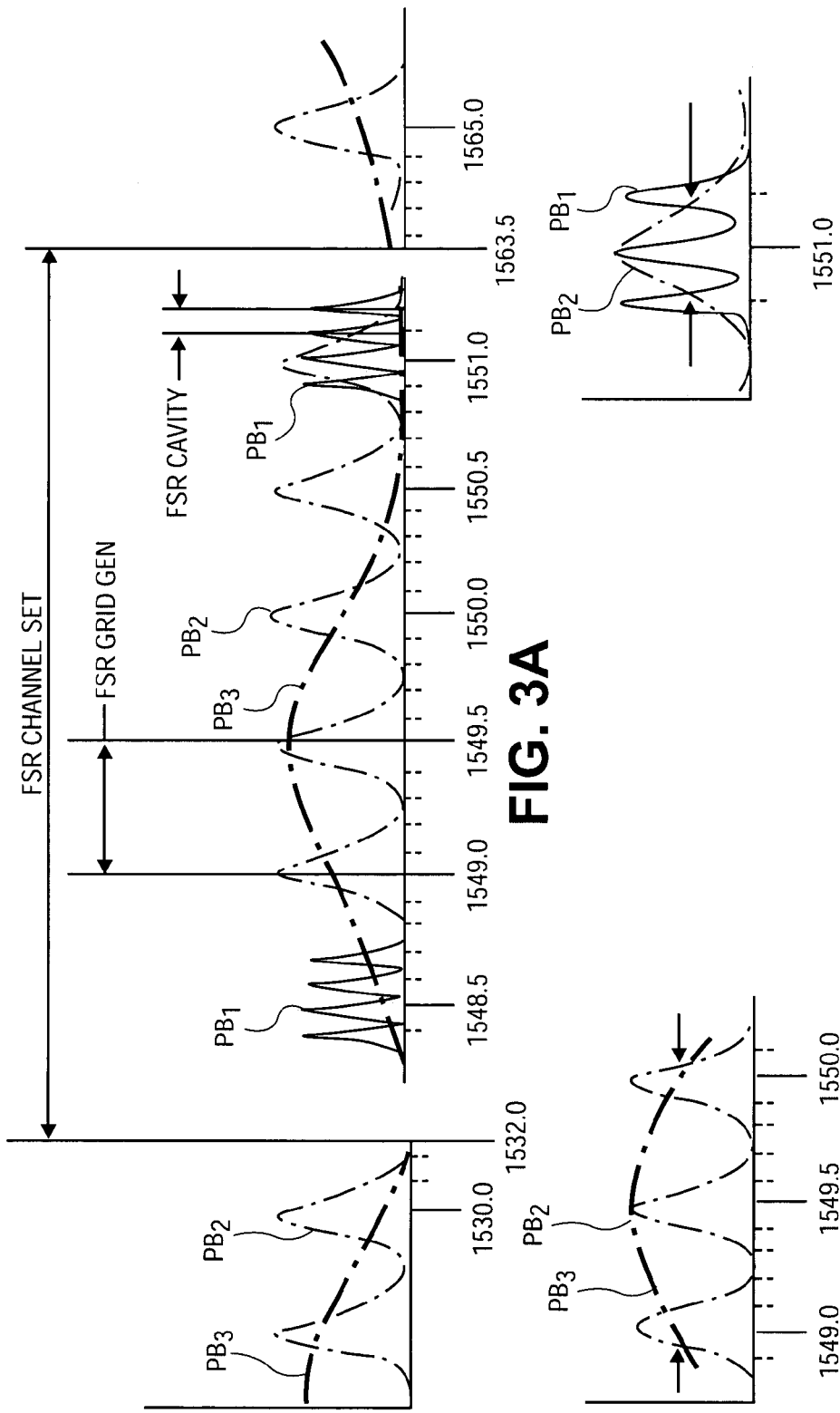
FIGS. 3A–3C are graphical illustrations of pass band characteristics of the external cavity laser of FIG. 2 for the channel selector, grid etalon and external cavity with respect to a selected channel in a wavelength grid.

The finesse of grid etalon 34 and wedge etalon 36 determine the attenuation of neighboring modes or channels. As noted above, finesse is equal to the free spectral range over the full width half maximum, or finesse=FSR/FWHM. The width for a grid etalon pass band PB2 at half maximum is shown in FIG. 3B, and the width for a wedge etalon pass band PB3 at half maximum is shown in FIG. 3C. The positioning of grid etalon 34 and wedge etalon 36 within the external cavity improves side mode suppression.

Figure 4A:
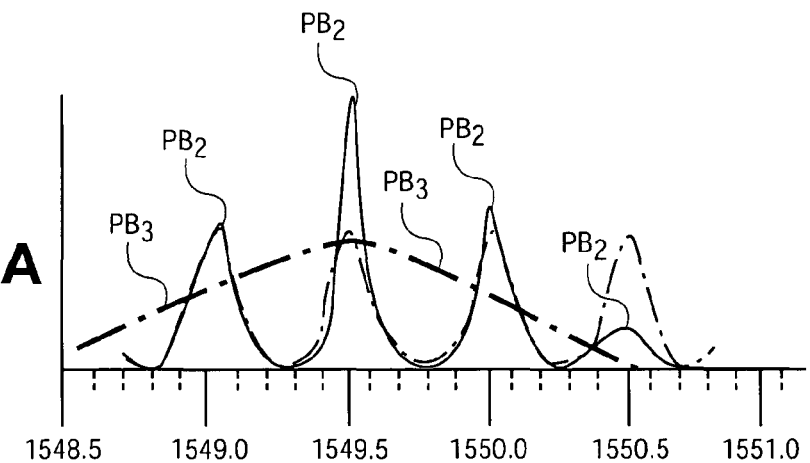
FIGS. 4A–4C are graphical illustrations of gain response to tuning of the external cavity laser of FIG. 2 for a plurality of channels in a wavelength grid.
Figure 4B:
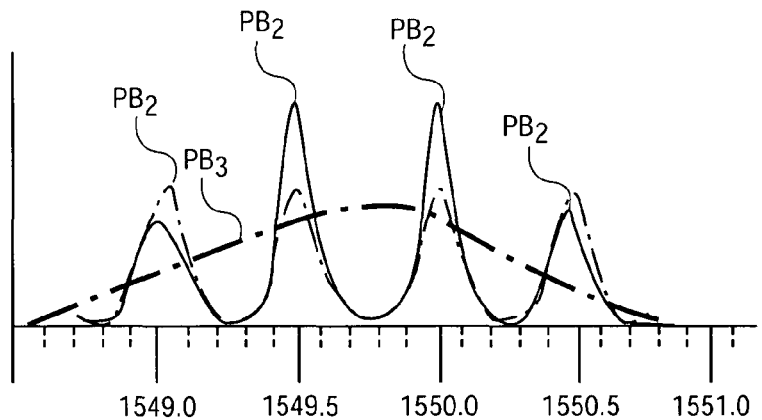
Figure 4C:
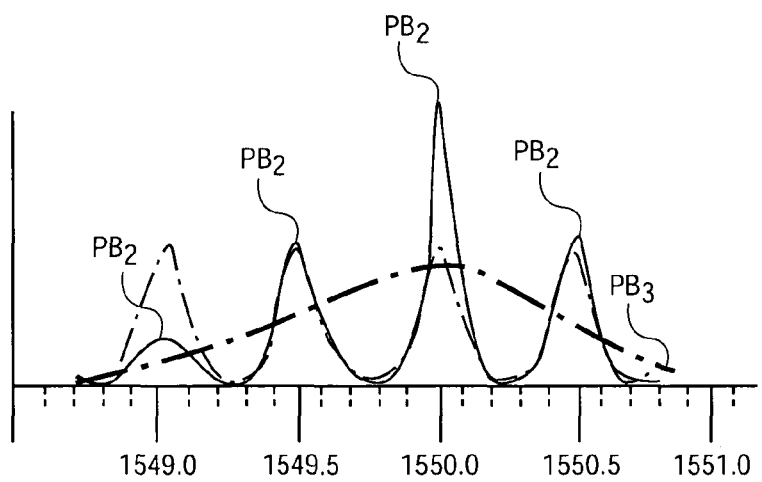

The tuning of the band pass PB3 of wedge etalon 36 between a channel centered at 1549.5 nm and an adjacent channel at 1550 nm is illustrated graphically in FIG. 4A–4C, wherein the selection of a channel generated by grid etalon 34 and the attenuation of adjacent channels or modes is shown. The external cavity pass bands PB1 shown in FIG. 3A–3C are omitted from FIG. 4A–4C for clarity. The grid etalon 34 selects periodic longitudinal modes of the external cavity corresponding to the grid channel spacing while rejecting neighboring modes. The wedge etalon 36 selects a particular channel in the wavelength grid and rejects all other channels. The selected channel or lasing mode is stationary at one particular channel for filter offsets in the range of approximately plus or minus one half channel spacing. For larger channel offsets the lasing mode jumps to the next adjacent channel.

In FIG. 4A, the wedge etalon pass band PB3 is centered with respect to the grid channel at 1549.5 nm. The relative gain associated with pass band PB2 at 1549.5 nm is high, while the relative gain levels associated with adjacent pass bands PB2 at 1549.0 nm and 1550.0 nm are suppressed relative to the selected 1549.5 nm channel. The gain associated with pass bands PB2 at 1550.5 nm and 1548.5 nm is further suppressed. The dashed line indicates the relative gain for pass bands PB2 without suppression by wedge etalon 26.

FIG. 4B shows the wedge etalon pass band PB at a position in between the channels at 1549.5 nm and 1550.0 nm, as occurs during channel switching. The relative gain associated with pass bands PB2 at 1549.5 nm and 1550.0 are both high, with neither channel suppressed. The relative gain levels associated with pass bands PB2 at 1549.0 nm and 1550.5 nm are suppressed relative to the 1549.5 nm and 1550.0 nm channels. The dashed line indicates the relative gain for pass bands PB2 without suppression by wedge etalon 26.

FIG. 4C shows the wedge etalon pass band PB3 centered with respect to the grid channel at 1550.0 nm, with the relative gain associated with the pass band PB2 at 1550.0 nm being high, while the relative gain levels associated with adjacent pass bands PB2 at 1549.5 nm and 1550.5 nm are suppressed relative to the selected 1550.0 nm channel, and the gain associated with pass bands PB2 at 1551.0nm and 1549.0 nm is further suppressed. Again, the dashed line indicates the relative gain for pass bands PB2 without suppression by wedge etalon 26.

The external cavity pass bands PB1, while not shown in FIG. 4A–FIG. 4C, are an important consideration in the tuning of external cavity laser 20. Ideally, one of the external cavity pass bands PB1 will be aligned with or locked to the selected grid generator pass band PB2 and the channel selector pass band PB3 when the external cavity laser 20 is tuned to a selected channel wavelength. Adjustment of the external cavity pass bands PB1 in this manner is achieved by thermally positioning end mirror 24 with compensating member 16 to adjust the external cavity optical path length in accordance with the invention.

Figure 5:
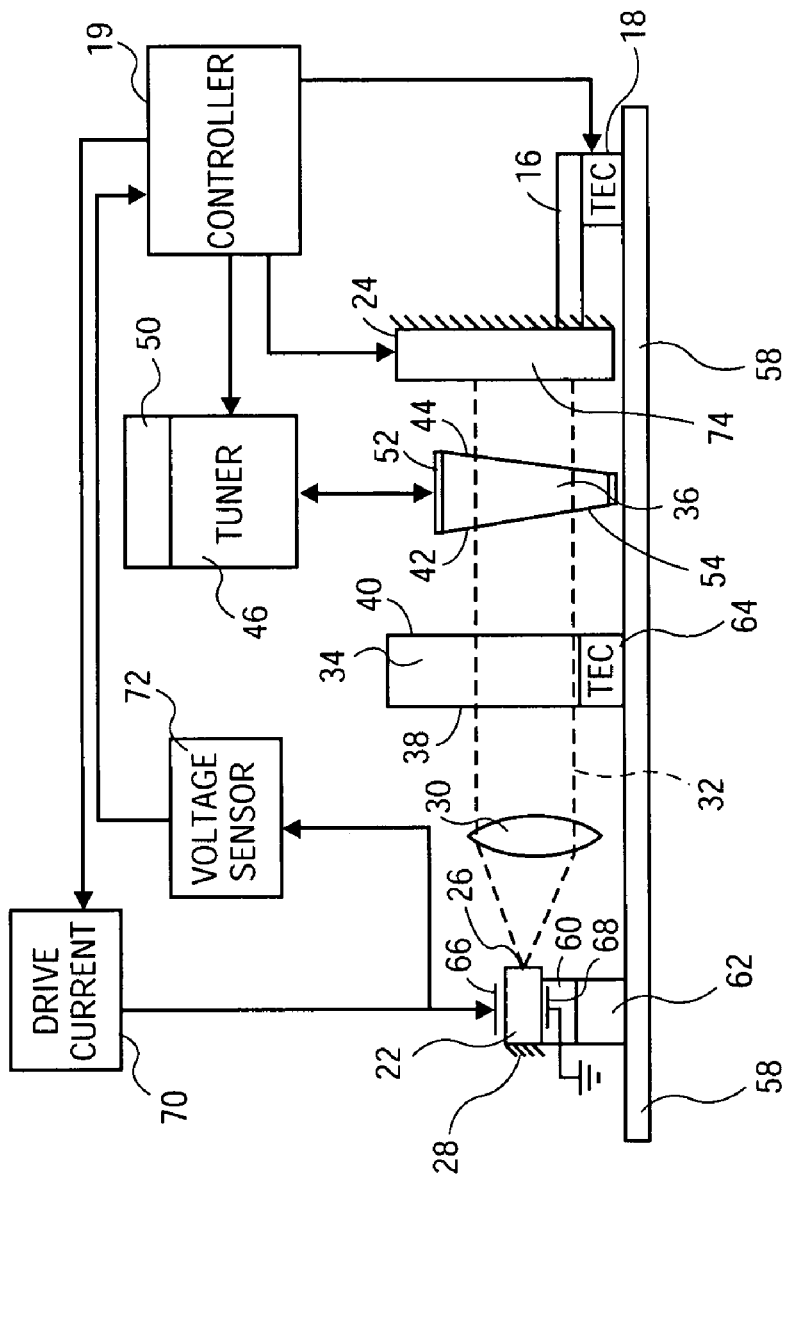
FIG. 5 is another embodiment of an external cavity laser apparatus.

Referring now to FIG. 5, another embodiment of an external cavity laser apparatus 56 with thermal external cavity tuning is shown, with like reference numbers used to denote like parts. In the apparatus 56, the various components are mounted onto or otherwise supported by a common base 58 to allow collective, passive thermal stabilization of the various parts of the apparatus 56 as described further below. Gain medium 12 is coupled to a thermoelectric controller 60, which is mounted on a support or platform 62. Platform 62 in turn is mounted onto base 58. Platform 62 serves to properly position gain medium 12 such that collimator 30, grid etalon 34, wedge etalon 36 and end mirror 24 are positioned in the optical path 32 defined by the beam emitted from facet 26 of gain medium 22. Thermoelectric controller 18 is mounted on base 58, such that compensating member 16 and end mirror 24 are mounted to base 58 through thermoelectric controller 18. Thermoelectric controller 60 provides thermal control to gain medium 12 to prevent thermal fluctuation thereof that would alter the optical thickness between facets 26, 28. Grid generator 34 is coupled to a thermoelectric controller 64, and thermoelectric controller 64 is mounted on base 58. Thermoelectric controller 64 provides temperature control to grid etalon 34 to avoid or minimize fluctuation in the optical thickness between faces 38, 40 that would alter the communication grid defined by grid generator 34.

Base 58, platform 62 and compensating member are made from materials that have good thermal conductivity, and with materials of selected coefficients of thermal expansion (CTE) to provide for passive thermal stabilization as described further below. Base 58, compensating member 18 and platform 62 may comprise a copper-tungsten alloy which provides good thermal conductivity and a high degree of tailorability by variation of the ration of copper to tungsten, or aluminum and/or an aluminum alloy. Base 58, platform 62 and compensating member 18 may alternatively comprise a variety of materials which provide thermal conductivity and which allow precise selection of CTE. Material selection for desired CTE is well known in the art, and suitable materials may include, for example, various metals, metal alloys, metal nitrides, metal carbides and/or blends, composites, mixtures or alloys thereof.

Electrodes 66, 68 are coupled to gain medium 12, with electrode 66 operatively coupled to a drive current source 70, and with electrode 68 suitably grounded. Drive current source 70 is operatively coupled to controller 19, and controller 19 may regulate the current delivered to gain medium 22 as required. A voltage sensor 72 is operatively coupled to electrode 66 and to controller 19. Voltage sensor 72 is configured to monitor the voltage across gain medium 22 during laser operation and communicate a sensor output to controller 19 that is indicative of the monitored voltage. Since optical feedback from end mirror 24 is reflected back into gain medium 22 through facet 26, the monitored voltage is indicative of optical losses associated with the external cavity defined by end mirror 24 and gain medium facet 28. Error signals may thus be derived from the output of voltage sensor 72 which may be used by controller 19 to re-position end mirror 24, by heating or cooling of compensating member 16, to adjust the external cavity and null out the error signal. Optical feedback from the faces 38, 40 of grid etalon 32, and faces 42, 44 of wedge etalon 36 are also reflected back into gain medium 22, and in some embodiments the sensed voltage across gain medium may provide error signals usable for adjustment of grid etalon 34 via thermoelectric controller 64, and wedge etalon 36 by tuner 46.

In the operation of laser 56, current is applied to gain medium 22 by drive current source 70 via electrodes 66, 68, according to instruction from controller 19. Voltage across gain medium 22 is measured by voltage sensor 72 and communicated to controller 19. Various instances may arise in which the external cavity pass bands PB1 are not optimally positioned with respect to the selected grid etalon pass band PB2 and wedge etalon pass band PB3, either due to external environmental factors such as vibration or thermal fluctuation, or due to a channel changing event wherein wedge etalon 36 is intentionally positioned to select a different transmission channel as described above. In such instances, losses will arise in the external cavity defined by end mirror 24 and gain medium facet 28, and controller 19 may selectively instruct the heating or cooling of compensating member 16 by thermoelectric controller 18 to position or tune end mirror 24 to minimize the external cavity loss and null the error signal.

The external cavity laser apparatus 56 may also include a dither element 74 configured to introduce a frequency modulation into the external cavity. The presence of a known frequency modulation in the laser external cavity provides a good mechanism for developing error signals indicative of external cavity losses, as described further below. As shown in the embodiment of FIG. 5, dither element 74 comprises a transparent electro-optic coupled to end mirror 2. Dither element 74 may be operatively coupled to controller 19. Dither element 74 is capable of generating a frequency modulation according to voltage modulation applied across element 74 by electrodes (not shown). The electro optic material of dither element 74 may comprise, for example, lithium niobate or other electro-optic material that is transparent to the beam traveling along optical path 32. End mirror 24 may comprise a reflective surface deposited directly onto the electro-optic material of dither element 74. The modulation introduced by dither element 74 may comprise, for example, a frequency modulation of about 20 KHz. Adjustment of voltage across the electro-optic material of element 74 changes the effective optical thickness of element 74, and hence the overall optical path length l across the external cavity (between diode facet 18 and end mirror 14) of external cavity laser 56.

Dither element 74 may alternatively comprise an acousto-optic or piezo-optic material, or any other material or device capable of providing a frequency modulation to the external cavity of laser 56. Dither element 74 may be uncoupled from end mirror 24 and located elsewhere in the external cavity, or may be outside the external cavity and suitably positioned to introduce a frequency modulation in end mirror 24 and thus the external cavity. The use of an electro-optic dither element uncoupled from an end reflector is described in U.S. patent application Ser. No. 09/900,426 entitled "Evaluation and Adjustment of Laser Losses According to Voltage Across Gain Medium" to inventors Daiber et al., filed concurrently herewith, and the use of a piezoelectric dither element external to an optical cavity is described in U.S. patent application Ser. No. 09/814,646 entitled "Error Signal Generation System" to inventor Andrew Daiber and filed on Mar. 21, 2001, the disclosures of which are incorporated herein by reference. U.S. patent application Ser. No. 09/900,426 entitled "Evaluation and Adjustment of Laser Losses According to Voltage Across Gain Medium", noted above, also discloses control systems usable for external cavity lasers with dither elements configured to provide frequency modulation to an end mirror or other loss elements.

Modulation of the optical path length l via frequency dither introduced by element 58 produces intensity variations in the output power of external cavity laser 56, as noted above. This modulation is detectable in the monitored voltage across gain medium 22, due to optical feedback thereinto from the external cavity. These intensity variations will decrease in magnitude and phase error as a laser cavity mode or pass band is aligned with the center wavelength of the pass bands defined by grid generator 34 and channel selector 36. In other words, the intensity variations and phase error in the modulation signal are minimal or nominally zero when pass bands PB1, PB2 and PB3 are optimally aligned as shown in FIG. 3A–3C. The use of intensity variation and phase error in the modulated signal with respect to error signal determination is described further below with reference to FIG. 6.

During operation of the external cavity laser 56 with dither element 74, voltage signals from voltage sensor 72 are communicated to controller 19, which derives an error signal from the modulation introduced by the frequency dither, and communicates a compensation signal to thermoelectric controller 18, which heats or cools compensating member 16, which in turn expands or contracts accordingly to tune or adjust the optical path length l by positionally adjusting end mirror 24. Controller 19, during the operation of laser 56, may also control. the drive current to gain medium 12 and the positioning of channel selector 36 by tuner 46. Controller 19 may also control the temperature of grid etalon 34 via thermoelectric controller 66.

Figure 6:
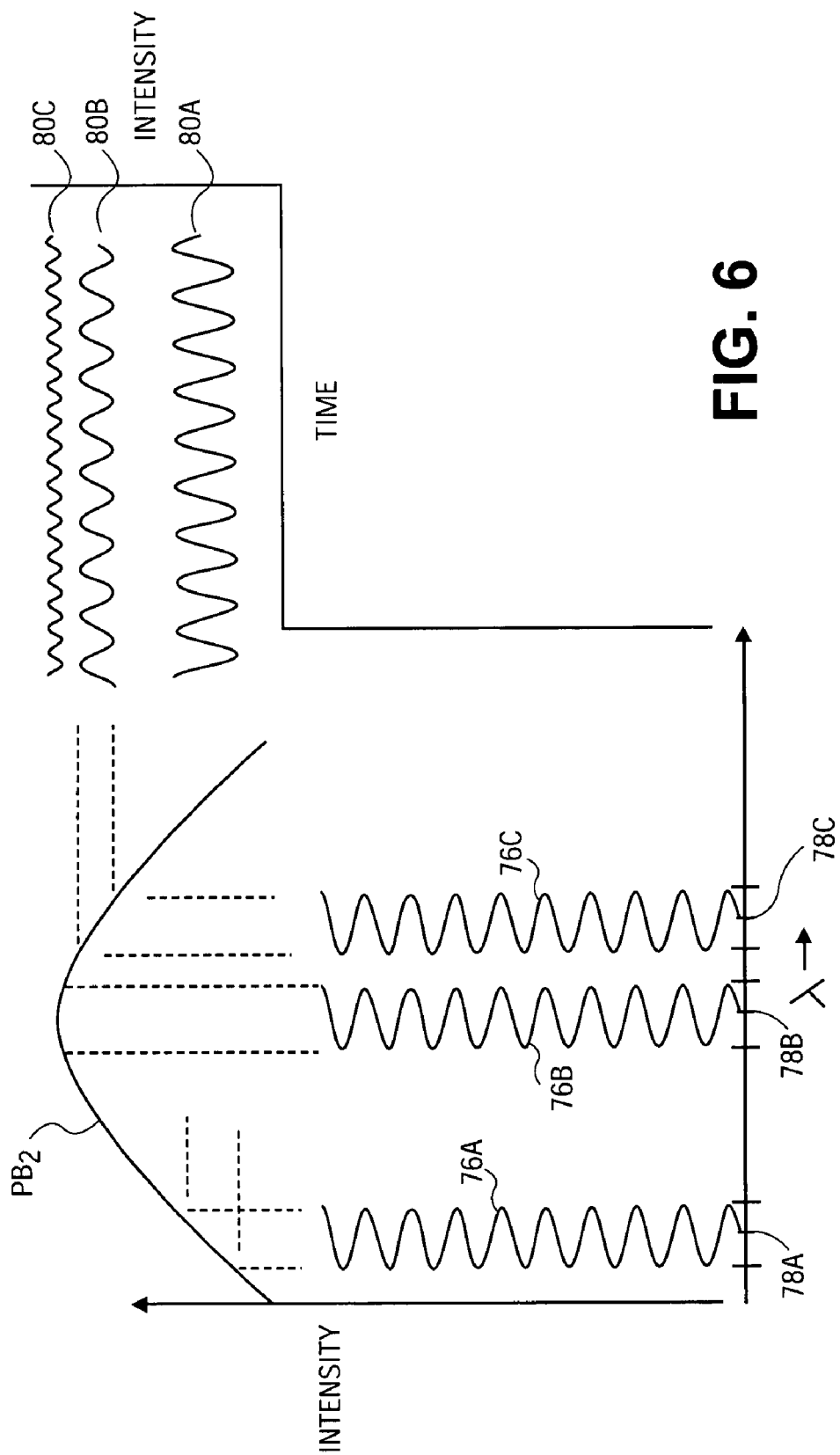
FIG. 6 is a graphical illustration of the error signals derived from frequency modulation of the external cavity.

Referring also to FIG. 6, the relationship of the dither modulation signal introduced to an external cavity with respect to the detected voltage modulation across gain medium 12 is illustrated graphically as wavelength versus relative intensity. FIG. 6 shows a grid etalon pass band PB2, together with frequency or dither modulation signals 76A, 76B, 76C corresponding to external cavity laser modes 78A, 78B and 78C respectively. Frequency modulation signals 76A–C are introduced to the laser external cavity by voltage modulation of electro-optic element 58 in the manner described above. As shown in FIG. 6, laser mode 78A is off-center with respect to the center of pass band PB2 towards the shorter wavelength side of pass band PB2, while laser mode 78B is located at about the center wavelength of pass band PB2, and laser mode 78C is located on the longer wavelength side of pass band PB2. Laser mode wavelength 78B corresponds to a wavelength lock position and represents an optimal loss profile for the external cavity. Laser modes 78A and 78B are off-center with respect to pass band PB2 and result in non-optimal cavity loss profiles which will require adjustment of the external cavity length l, either by adjusting the effective optical thickness of electro-optic element 58 or by positioning end mirror 14 as described above.

The voltage detected across gain medium 22 by voltage sensor 72 for dither modulation signals 76A, 76B and 76C are shown respectively as voltage modulation signals 80A, 80B and 80C on the right side of FIG. 6, which correspond respectively to the laser mode wavelengths 78A, 78B and 78C. The location of laser mode 78A at a wavelength shorter than that of the center wavelength of pass band PB2 results in voltage signal 80A having a modulation that is in phase with the dither modulation signal 76A. The location of laser mode 78C at a greater wavelength than the center wavelength of pass band PB2 results in a modulation of voltage signal 80C that is out of phase with respect to the modulation of dither signal 76C.

The location of each laser mode wavelength with respect to the slope of pass band PB2 affects the amplitude of the corresponding voltage signal. Thus, voltage signal 80A, which corresponds to laser mode 78A wavelength on a relatively steep slope of pass band PB2, has a relatively large modulation amplitude, while voltage signal 80C, which corresponds to laser mode 78C associated with a portion of pass band PB2 having a less steep slope, has a correspondingly smaller modulation amplitude. Voltage signal 80B, which corresponds to centered laser mode 78B, has a minimal modulation amplitude since the period of the dither modulation signal 76B occurs symmetrically about the center wavelength of pass band PB2. The frequency of the dominant intensity in the case of voltage signal 80B in this instance is twice the frequency of dither modulation signal 76B.

From FIG. 6 it can be seen that the amplitude of the modulation detected in the voltage across gain medium 22 by detector 72 indicates the magnitude of correction or adjustment required for the laser external cavity, while the phase of voltage signal modulation indicates the direction of the adjustment. The amplitude of dither modulation signals 76A–C is selected so that, during wavelength lock, the variation in the intensity of voltage signal modulation is held to acceptable levels for the particular use of the external cavity laser. The frequency of the dither modulation is chosen to be high enough to provide coherence control, but low enough to prevent interference with information modulated onto the carrier signal provided by the external cavity laser during transmission. As noted above, a dither frequency of around 20 KHz is effective for the specific tuning shown in FIG. 4A–4C.

The active thermal control for positioning of end mirror 24 as described above may be used together with passive thermal stabilization of the external cavity of laser 56 and the optical components therein as well. Passive thermal stabilization or "athermalization" comprises, in its simplest form, the use of passive elements of differing coefficients of thermal expansion (CTE) joined end-to-end and having lengths that are inversely proportional in ratio to the ratio of the CTEs of the elements. The distance between the unjoined ends of the elements, in this instance, will remain constant, independent of temperature, although the length of the individual elements will vary with varying temperature. Numerous complex optical structures have been built using the above principle. The principles of passive athermalization are well known and are described in Yoder et al., "Opto-mechanical Systems Design" Second Edition, 1993, Marcel Dekker Inc., Chapter 14; "Optical Instrument Structural Design", the disclosure of which is incorporated herein by reference.

The use of passive thermal stabilization alone in an external cavity laser, without active thermal control of the external cavity as provided by the invention, is beneficial but may be difficult to implement accurately in certain laser architectures. Thus, changes in laser properties may still result due to thermal gradients and temperature variations that cannot be easily compensated by passive thermal stabilization. The invention provides for the detection of such changes in laser properties by voltage monitoring or otherwise, and then varying the temperature of a structural member associated with the external cavity according to the detected variation to adjust the external cavity optical path length as described above.

Temperature changes during laser operation affect the overall cavity length and index of refraction of the cavity and components therein, which will in turn result in variations in output wavelength and optical losses associated "unlocking" of the external cavity modes from the selected transmission channel wavelength. As the optical path length of the external cavity varies with respect to temperature, the integral number of half-wavelengths that may be supported in the cavity varies. The optical path length of an external cavity is a function of the physical thickness of each element, including optical components and air within the external cavity, as well as the refractive index of each component and the air. Two elements with identical optical thickness and different indices of refraction will each support a different number of half-wavelengths therethrough. Once an output wavelength is selected for an external cavity laser as described above, any variation in the optical path length of the external cavity will result in optical losses in the output beam brought about by misalignment of external cavity pass bands with the selected grid pass band.

FIG. 7A and FIG. 7B schematically show passive thermal stabilization aspects associated with external cavity lasers 82, 84 respectively, with like reference numbers used to denote like parts. External cavity lasers 82, 84 each include a foundation or base 58, a gain medium 22 with facets 26, an end mirror or reflector 24 mounted on a compensating member 18, and a tuning element or channel selector 36. Various additional optical elements are shown collectively as optics 86, which may include a grid generator, collimating optics, polarizing optics and/or other optical components. (not shown). A thermoelectric controller (not shown) is coupled to compensating member 18 for active thermal control thereof as described above. Gain medium 22 is mounted to base 58 via mounting element 88, and compensating element 18 is mounted to base 58 via mounting element 90.

In each of the external cavity lasers 82, 84, a resonant external cavity is formed with length $L_{Opl}$ between rear facet 28 and end mirror 24. In the external cavity laser 82, the compensating member 18 is configured to passively decrease the length $L_{Opl}$ during thermal expansion, with end mirror 24 being moved into the external cavity during expansion of member 18. In external cavity laser 84, the compensating member 18 is configured to passively increase the length $L_{Opl}$ during thermal expansion, and end mirror 24 is moved outward with respect to the external cavity during thermal expansion of member 18. During thermal expansion of base, mounting elements 88, 90 will move apart from each other.

The compensating member 18 ideally is structured and configured to maintain an optical path length $L_{Opl}$ that does not vary with temperature (except during active thermal control of compensating member 18). As shown in FIG. 7A, the optical path length $L_{Opl}$ may be expressed as the sum of the optical paths through the individual components of the laser 82, including gain medium 22, channel selector 36, collective optical elements 86, and air gaps, $L_{a1}$, $L_{a2}$, $L_{a3}$ between the aforementioned elements. The optical thickness or path length through gain medium 22 is $L_d$, while the optical path length through elements 86 is $L_f$, and the optical path length through channel selector 36 is $L_t$. The optical path length through the air gap between gain medium 22 and optical elements 86 is $L_{a1}$, while the optical path length through the air gap between optical elements 86 and channel selector 36 is $L_{a2}$, and the optical path length between channel selector 36 and end mirror 24 is $L_{a3}$. Since all elements of laser 82 are directly or indirectly coupled to base 58, their relative physical separation will typically increase as the temperature of base 58 increases. This may in turn result in variation of the cavity optical path length $L_{Opl}$.

The optical path length of an element generally is equal to the product of its refractive index and its dimension along the optical path. The optical path length of an external cavity laser is a sum of the products of indices of refraction and optical thicknesses of the various elements present in the optical path across the external cavity, including air present within the cavity. The optical path length of an external cavity laser thus can be shown as $$L_{Opl} = \Sigma n_i \cdot l_i \qquad (1)$$

wherein $n_i$ is the index of refraction of each element and $l_i$ is the thickness of the element along the optical path. A lower case l as used herein references the physical dimension of an element, while an upper case L references an optical dimension. The integer number of half-wavelengths supported by an element with fixed end points increases as the refractive index of the element increases, as predicted by Huygens principle. This results from the observation that light travels more slowly in media of higher refractive index and the wave peaks are correspondingly more closely packed. Thus, over an identical distance, an element with a higher index of refraction supports a greater number of wavelengths, and the optical path length, rather than the physical path length, is a more accurate measure of the integral number of half wavelengths that may be supported by an external cavity.

As a first order approximation, the thermal expansion required by compensating element 18 to maintain the physical path length dimension of the external cavity ($l_{Opl}$) constant. This requirement is met provided that $dl_F/dT = dl_C/dT$ for the configuration shown in FIG. 7A. Given the physical distance between attachment points 88, 90 and the coefficient of thermal expansion $\alpha_F$ for base 58, the required combination of material and thickness between mount 90 and end mirror 24 may be determined so as to hold constant the physical distance between the cavity end points as defined by facet 28 and end mirror 24. There would exist several potential sources of error in the first order approximation. First, optical and physical path lengths are not the same, as noted above. Instead, for each segment of the optical path (e.g., $L_d$, $L_1$, $L_f$, $L_{a1}$, $L_{a3}$), the refractive index of each element must be considered in order to hold the integer number of half wavelengths in the cavity constant. Second, in determining the number of wavelengths each element can support, the expansion of the element must be calculated. Expansion of each element varies depending on its coefficient of thermal expansion and cross-sectional thickness along the optical path. Additionally, during temperature variations, some cavity elements may expand while others contract, thus varying the average weighted refractive index of the cavity. The average weighted refractive index is the sum of the products of physical length and refractive index for each element divided by the physical length of the cavity. For example, during a temperature increase, the air gap $L_{a3}$ may decrease due to rapid thermal inward expansion of the compensating element 18, while the optical element(s) increase in thickness. A third source of error results from the fact that the refractive index of each element varies with temperature, and varies by different amounts. What is needed is a way to incorporate all of these variables into the choice of material and dimensions for the compensating element 18 such that the external cavity is optically stable over a broad temperature range.

A more accurate way of determining the combination of material and thickness or dimension for compensating element 18 is provided by equation (2) in which the temperature related variation in optical path length due to changes in the physical length of each element as well a the change in the index of refraction is express.

$$0 = \frac{dL_{Opl}}{dT} = \sum \frac{d(n_i \cdot l_i)}{dT} = \sum \left( n_i \cdot \alpha i + \frac{dni}{dT} \right) \cdot li \qquad (2)$$

In equation (2), the requirement that the rate of change of the optical path length $L_{Opl}$ with respect to temperature be zero satisfies the condition that the optical path length be temperature invariant. The optical path length is expressed as the sum of the derivatives of the product of the refractive index $n_i$ of each element, the thermal expansion coefficient $\alpha_i$ of each element, and the physical length $l_i$ of each element. As noted above, the various elements of the external cavity include the gain medium 22, channel selector 36, other optics 86, and the air or other gas present in the optical path.

The optical path of the external cavity laser 82 in FIG. 7A is the sum of the optical length of the individual segments of which it is composed, including the regions of air or other gas separating the optical components. This relationship may be expressed in the solution to equation (1) shown in equation (3)

$$L_{Opl} = L_d + L_1 + L_t + L_{123} = n_d l_d + n_l l_l + n_t l_t + n_a l_{a123} \qquad (3)$$

The air gap length, $l_{a123}$, is affected by expansion and contraction of base 58 and compensating member 18, and the air gap can be expressed in terms of the dimensions of base 58, $l_{Fl}$, and the dimensions of compensating member 18, $l_c$. Equation (3) can then be expressed as $$L_{Opl}=n_d l_d+n_l l_l+n_t l_t+n_a(l_{Fl}-l_d-l_l-l_c) \quad (4)$$

Equation (4) can be expressed as equation (5) below, to show the optical path length in terms of the optical length $L_{Fl}$ of base 58, the additional optical length LO produced by the optical elements 86 in the cavity, and the optical length $L_C$ of the compensating element 18.

$$L_{Opl}=[n_a l_{Fl}]+[(n_d-n_a)l_d+(n_l-n_a)l_l+(n_t-n_a)l_t]-[n_a l_c] \quad (5)$$

Equation (5) can be shown as $$L_{Opl}=L_F+L_O-L_C \quad (6)$$

The derivative of $L_{Opl}$ is determined and set equal to zero, as indicated by equation (2) above. This provides a solution for the derivative of the optical length of the compensating element 18, $L_C$ in terms of the sum of the derivative $L_F$ of the optical length of base 58 and the optical path length $L_O$ produced by optical elements 86 in the external cavity as set forth in equation (7) below. The coefficients of thermal expansion $\alpha_c$, $\alpha_F$, $\alpha_d$, $\alpha_l$ for the compensating element 18, base 58, gain medium 22 and optical components 86 respectively are used in solving the derivative. Additionally, the refractive indices $n_a$, $n_d$, $n_l$, and $n_t$ for air, gain medium 22, optical elements 86 and channel selector 36 respectively are used to obtain the following solution.

$$[n_a l_c]=[n_a l_F]+[(n_d-n_a)l_d+(n_l-n_a)l_l+(n_t-n_a)l_t] \quad (7)$$

Equation (7) can be shown as.

$$L_C=L_F+L_O \quad (8)$$

The derivatives in equation (7) may be solved to produce a solution for the product of the coefficient of thermal expansion and length of compensating element 18.

FIG. 7B shows a different arrangement for compensating member 18 with respect to base 58, such that expansion of compensating member 18 results in increasing the external cavity optical path length of laser 84. This relationship may be shown in the solution to equation (1) provided in equation (9).

$$L_{Opl}=L_d+L_l+L_t+L_{a124}=n_d l_d+n_l l_l+n_t l_t+n_a l_{a124} \quad (9)$$

As noted above, the air gap length $l_{a123}$ is affected by expansion and contraction of base 58 as well as compensating member 18. In this case, however, the expansion of compensating member 18 has an opposite effect to that noted for FIG. 7A. The air gap length can be expressed in terms of the dimension $l_{Fl}$ of base and the dimension $L_c$ of compensating member 18. The solution of equation (9) can be shown as equation (10).

$$L_{Opl}=n_d l_d+n_l l_l+n_t l_t+n_a(l_{Fl}-l_d-l_l+l_c) \quad (10)$$

Equation (10) can be expressed in terms of the optical length $L_{Fl}$ of base 58, the additional optical length $L_O$ provided by optics 86, and the optical length $L_C$ of compensating member 18.

$$L_{Opl}=[n_a l_{Fl}]+[(n_d-n_a)l_d+(n_l-n_a)l_l+(n_t-n_a)l_t]-[n_a l_c] \quad (11)$$

or, more simply, $$L_{Opl}=L_F+L_O+L_C \quad (12)$$

Finding the derivative of LOpl and setting it equal to zero provides a solution for the derivative of the of the optical length $L_{C'}$ of compensating element 18 in terms of the sum of the derivative $L_F$ of the optical length of base 58, and $L_O$ of the optical components 86 as shown in equation (13) below. The coefficients of thermal expansion $\alpha_c$, $\alpha_F$, $\alpha_d$, $\alpha_l$ for compensating element 18, base 58, gain medium 22, optics 86 and channel selector 36 respectively, may be used in solving the derivative. In addition, the indices of refraction $n_a$, $n_d$, $n_l$, and $n_t$ for air, gain medium 22, optical elements 86 and channel selector 36 respectively are used to obtain the derivative $$-[n_a l_c]=[n_a l_F]+[(n_d-n_a)l_d+(n_l-n_a)l_l+(n_t-n_a)l_t] \quad (13)$$

which can be expressed as $$-L_C=L_F+L_O \quad (14)$$

Solution of equation (13) provides a product of coefficient of thermal expansion and dimension for compensating element 18 that provides passive thermal stabilization for the external laser structure of FIG. 7B.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

The invention claimed is:

1. A laser apparatus, comprising:
   first and second reflectors defining a laser cavity;
   a gain medium to emit light along an optical path between said first and second reflectors;
   a compensating member coupled to one of said first and second reflectors and configured to actively thermally adjust an optical path length between said reflectors by thermally positioning the one of the first and second reflectors, wherein compensating member is to position said first reflector with respect to said second reflector; and
   a controller coupled to the compensating member to actively thermally control said compensating member.

2. The laser apparatus of claim 1, wherein said controller comprises a thermoelectric controller operatively coupled to said compensating member to thermally adjust a length of said compensating member.

3. The laser apparatus of claim 1 wherein the gain medium has first and second output facets, said first output facet to emit said light along said optical path, said first reflector positioned in said optical path, said second output facet defining said second reflector, said first reflector and said second output facet defining said laser cavity.

4. The laser apparatus of claim 3, wherein said gain medium and said first reflector are passively athermalized with respect to each other.

5. The laser apparatus of claim 1, wherein said compensating member is thermally conductive.

6. The laser apparatus of claim 1, wherein said compensating member has a high coefficient of thermal expansion.

7. The laser apparatus of claim 1, further comprising:
   a detector associated with said laser cavity and configured to detect losses associated with said laser cavity; and
   a controller operatively coupled to said compensating element and said detector and configured to thermally adjust a length of said compensating member according to error signals derived from said detector.

8. The laser apparatus of claim 7, further comprising a dither element operatively coupled to said laser cavity and configured to introduce frequency modulation to said laser cavity.

9. A method for generating a tunable optical output, comprising:
- emitting the optical output from a first facet of a gain medium along an optical path;
- reflecting said optical output from an end reflector positioned in said optical path, said end reflector and a second facet of said gain medium defining a resonant cavity; and
- actively controlling an optical path length of said resonant cavity by actively thermally adjusting a length of a compensating member coupled to position said end reflector.

10. The method of claim 9, wherein said actively controlling said compensating member comprises heating or cooling said compensating member with a thermoelectric controller coupled to said compensating member.

11. The method claim 9, further comprising passively athermalizing said resonant cavity.

12. The method of claim 9, further comprising monitoring losses associated with said resonant cavity.

13. The method of claim 12, wherein said monitoring comprising monitoring voltage across said gain medium.

14. The method of claim 12, further comprising introducing a frequency modulation into said resonant cavity.

15. The method of claim 12, wherein said thermally adjusting is carried out according to error signals derived from said monitoring of said frequency modulation introduced to said resonant cavity.

16. A laser apparatus, comprising:
- first and second reflectors defining a laser cavity;
- means to emit light along an optical path between said reflectors; and
- means for actively thermally adjusting a length of the optical path between said reflectors, wherein said actively thermally adjusting means comprises a compensating member to thermally position said only first reflector.

17. The laser apparatus of claim 16, wherein said thermally adjusting means further comprises a thermoelectric controller to thermally adjust a length of said compensating member.

18. The laser apparatus of claim 16, further comprising means for passively thermally stabilizing said laser cavity.

* * * * *